United States Patent
Stender et al.

(10) Patent No.: US 10,253,216 B2
(45) Date of Patent: Apr. 9, 2019

(54) ADDITIVES FOR BARRIER CHEMICAL MECHANICAL PLANARIZATION

(71) Applicant: Versum Materials US, LLC, Allentown, PA (US)

(72) Inventors: Matthias Stender, Phoenix, AZ (US); Maitland Gary Graham, Tempe, AZ (US); Dnyanesh Chandrakant Tamboli, Gilbert, AZ (US); Xiaobo Shi, Chandler, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/630,584

(22) Filed: Jun. 22, 2017

(65) Prior Publication Data

US 2018/0002571 A1    Jan. 4, 2018

Related U.S. Application Data

(60) Provisional application No. 62/357,571, filed on Jul. 1, 2016.

(51) Int. Cl.
| | |
|---|---|
| *C09G 1/02* | (2006.01) |
| *B24B 37/04* | (2012.01) |
| *C09K 3/14* | (2006.01) |
| *H01L 21/321* | (2006.01) |
| *H01L 21/768* | (2006.01) |
| *C09G 1/00* | (2006.01) |

(52) U.S. Cl.
CPC .............. *C09G 1/02* (2013.01); *B24B 37/044* (2013.01); *C09G 1/00* (2013.01); *C09K 3/1463* (2013.01); *H01L 21/3212* (2013.01); *H01L 21/7684* (2013.01)

(58) Field of Classification Search
CPC ...... C09G 1/02; B24B 37/044; C09K 3/1463; H01L 21/3212; H01L 21/7684
See application file for complete search history.

(56) References Cited

U.S. PATENT DOCUMENTS

| | | | |
|---|---|---|---|
| 5,885,334 A | 3/1999 | Suzuki et al. | |
| 6,530,968 B2 | 3/2003 | Tsuchiya et al. | |
| 7,037,350 B2 | 5/2006 | Small et al. | |
| 7,736,405 B2 | 6/2010 | Darsillo et al. | |
| 8,597,539 B2 | 12/2013 | Li et al. | |
| 2002/0095872 A1* | 7/2002 | Tsuchiya .................. | C09G 1/02 51/307 |
| 2003/0124852 A1 | 7/2003 | Fang et al. | |
| 2003/0157804 A1* | 8/2003 | Puppe ...................... | C09G 1/02 438/692 |
| 2006/0124026 A1 | 6/2006 | Kollodge | |
| 2007/0117497 A1 | 3/2007 | Moeggenborg et al. | |
| 2007/0075291 A1 | 4/2007 | Paik et al. | |
| 2007/0082456 A1 | 4/2007 | Uotani et al. | |
| 2007/0181534 A1 | 8/2007 | Kamimura | |
| 2007/0220813 A1 | 9/2007 | Nam et al. | |
| 2008/0135520 A1 | 6/2008 | Sun | |
| 2008/0148649 A1 | 6/2008 | Liu | |
| 2008/0149884 A1 | 6/2008 | Siddiqui et al. | |
| 2009/0004863 A1 | 1/2009 | Kamimura | |
| 2013/0168348 A1 | 7/2013 | Li et al. | |
| 2013/0171824 A1 | 7/2013 | Li et al. | |
| 2015/0104941 A1 | 4/2015 | Graham et al. | |
| 2015/0344739 A1 | 12/2015 | Kamei et al. | |
| 2016/0358790 A1* | 12/2016 | Shi ...................... | H01L 21/3212 |

FOREIGN PATENT DOCUMENTS

| | | |
|---|---|---|
| EP | 3 101 076 A1 | 7/2016 |
| WO | 02051955 A1 | 4/2002 |
| WO | 02094957 A2 | 11/2002 |
| WO | 2009056491 A1 | 5/2009 |
| WO | 2009111001 A2 | 9/2009 |
| WO | 2014061417 A1 | 4/2014 |

OTHER PUBLICATIONS

Grover, G. S., "Effect of slurry viscosity modification on oxide and tungsten CMP", Wear 214 (1998), pp. 10-13.

* cited by examiner

*Primary Examiner* — Duy Vu N Deo
(74) *Attorney, Agent, or Firm* — Lina Yang

(57) ABSTRACT

A barrier chemical mechanical planarization polishing composition is provided that includes suitable chemical additives. The suitable chemical additives are silicate compound and high molecular weight polymers/copolymers. There is also provided a chemical mechanical polishing method using the barrier chemical mechanical planarization polishing composition.

34 Claims, No Drawings

ADDITIVES FOR BARRIER CHEMICAL MECHANICAL PLANARIZATION

CROSS REFERENCE TO RELATED APPLICATIONS

This application claim priority under 35 U.S.C. § 119(e) to U.S. provisional patent application No. 62/357,571, filed on Jul. 1, 2016, the entirety of which is incorporated herein by reference.

BACKGROUND OF THE INVENTION

The present invention relates to barrier chemical mechanical planarization ("CMP") polishing compositions (or slurries) used in the production of a semiconductor device, and polishing methods for carrying out chemical mechanical planarization. In particular, it relates to barrier polishing compositions that are suitably used for polishing patterned semiconductor wafers that are composed of multi-type films, such as barrier, Low k or ultra Low k, dielectric, and metal lines, vias or trenches.

Usually, a barrier layer covers the patterned dielectric layer and a metal layer covers the barrier layer. The metal layer has at least sufficient thickness to fill the patterned trenches with metal to form circuit interconnects.

A barrier typically is a metal, metal alloy or intermetallic compound, such as tantalum or tantalum nitride. The barrier forms a layer that prevents migration or diffusion between layers within a wafer. For example, barriers prevent the diffusion of interconnect metal such as copper or silver into an adjacent dielectric. Barrier materials must be resistant to corrosion by most acids, and thereby, resist dissolution in a fluid polishing composition for CMP. Furthermore, these barrier materials may exhibit a toughness that resists removal by abrasion abrasive particles in a CMP composition and from fixed abrasive pads.

In relation to CMP, the current state of this technology involves the use of a multi-step such as, for example, a two-step process to achieve local and global planarization.

During step 1 of a typical CMP process, a metal layer such as an overburdened copper layer is typically removed, while leaving a smooth planar surface on the wafer with metal-filled lines, vias and trenches that provide circuit interconnects planar to the polished surface. Thus, Step 1 tends to remove excess interconnect metals, such as copper. Then step 2 of a typical CMP process, frequently referred to as a barrier CMP process, follows to remove the barrier layer and excess metal layers and other films on the surface of the patterned wafers to achieve both local and global planarization of the surface on the dielectric layer.

U.S. patent application Publication No. 2007/0082456 provides a polishing composition which allows high-speed polishing while etching and erosion are prevented and the flatness of metal film is maintained. The polishing composition comprises (A) a compound having three or more azole moieties, (B) an oxidizing agent, and (C) one or more species selected from among an amino acid, an organic acid, and an inorganic acid.

U.S. patent application Publication No. 2007/0181534 teaches a barrier polishing liquid which includes (a) a nonionic surfactant represented by formula below, (b) at least one type of organic acid selected from the group consisting of an aromatic sulfonic acid, an aromatic carboxylic acid, and a derivative thereof, (c) colloidal silica, and (d) benzotriazole or a derivative thereof.

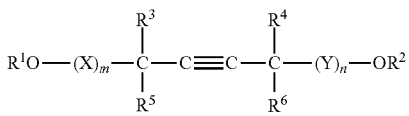

In the formula, $R^1$ to $R^6$ independently denote a hydrogen atom or an alkyl group having 1 to 10 carbons, X and Y independently denote an ethyleneoxy group or a propyleneoxy group, and m and n independently denote an integer of 0 to 20. There is also provided a chemical mechanical polishing method that includes supplying the barrier polishing liquid to a polishing pad on a polishing platen at a rate per unit area of a semiconductor substrate per unit time of 0.035 to 0.25 mL/(min·cm$^2$), and polishing by making the polishing pad and a surface to be polished move relative to each other while they are in a contacted state.

U.S. patent application Publication No. 2008/0149884 describes a composition and associated method for the chemical mechanical planarization (CMP) of metal substrates on semiconductor wafers. The composition contains a nonionic fluorocarbon surfactant and a per-type oxidizer (e.g., hydrogen peroxide). The composition and associated method are effective in controlling removal rates of low-k films during copper CMP and provide for tunability in removal rates of low-k films in relation to removal rates of copper, tantalum, and oxide films.

U.S. patent application Publication No. 2013/0168348 A1 has found an aqueous polishing composition, the aqueous polishing composition comprising (A) at least one type of abrasive particles which are positively charged when dispersed in an aqueous medium free from component (B) and having a pH in the range of from 3 to 9 as evidenced by the electrophoretic mobility; (B) at least one water-soluble polymer selected from the group consisting of linear and branched alkylene oxide homopolymers and copolymers; and (C) at least one anionic phosphate dispersing agent; and a process for polishing substrate materials for electrical, mechanical and optical devices making use of the aqueous polishing composition.

U.S. patent application Publication No. 2009/0004863 provides a polishing liquid for polishing a ruthenium-containing barrier layer, the polishing liquid being used in chemical mechanical polishing for a semi-conductor device having a ruthenium-containing barrier layer and conductive metal wiring lines on a surface thereof, the polishing liquid comprising an oxidizing agent; and a polishing particulate having a hardness of 5 or higher on the Mohs scale and having a composition in which a main component is other than silicon dioxide (SiO$_2$). The present invention also provides a polishing method for the chemical mechanical polishing of a semi-conductor device, the method comprising contacting the polishing liquid with the surface of a substrate to be polished, and polishing the surface to be polished such that contacting pressure from a polishing pad to the surface to be polished is from 0.69 kPa to 20.68 kPa.

U.S. patent application Publication No. 2013/0171824 discloses a CMP process for substrates containing silicon oxide dielectric films and polysilicon and/or silicon nitride films comprising the steps of (1) contacting the substrate with an aqueous composition containing (A) abrasive particles which are positively charged when dispersed in an aqueous medium having a pH in the range of from 3 to 9; (B) a water-soluble or water-dispersible linear or branched alkylene oxide homopolymer or copolymer; and (C) a water-soluble or water-dispersible polymer selected from (c1)

aliphatic and cycloaliphatic poly(N-vinylamide) homopolymers and copolymers, (c2) homopolymers and copolymers of acrylamide monomers of the general formulas I and II: $H_2C=C(-R)-C(=O)-N(-R^1)(-R^2)$ (I), $H_2C=C(-R)-C(=O)-R^3$ (II), wherein the variables have the following meaning: R is a hydrogen atom, a fluorine atom, a chlorine atom, a nitrile group, or an organic residue; $R^1$ and $R^2$ are a hydrogen atom or an organic residue; $R^3$ is a saturated N-heterocyclic ring; (c3) is a cationic polymeric flocculant; and (c4) mixtures thereof; (2) polishing the substrate until the silicon oxide dielectric film is removed and the polysilicon and/or silicon nitride film is or are exposed.

U.S. Pat. No. 8,597,539 claims the use of viscosity modifying agents but does not provide any specific examples neither does it explain their function. U.S. patent application Publication No. 2008/0148649 discloses the use of poly(l-vinylpyrrolidone-co-2-dimethylaminoethyl methacrylate) among a large number of other polymers as a surfactant in a ruthenium barrier CMP composition to reduce the removal rate of low-k films. International Publication No. WO 2002/094957 discloses the use of poly(2-acrylamido-2-methyl-1-propanesulfonic acid) in a metal CMP composition in which one part of the copolymer binds to metal surface and the other end is attracted to the polishing pad hence increase the removal rate of the metal film.

Grover et al. (Grover, G. S., et al. "Effect of slurry viscosity modification on oxide and tungsten CMP." Wear 214.1 (1998): 10-13.) describe CMP slurries with additives to increase viscosity. They observed reduced removal rates on silicon oxide films at increased slurry viscosity.

U.S. Pat. Nos. 6,530,968 and 7,736,405 describe the use of polymeric additives to increase viscosity and reduce dishing of metal lines in copper CMP applications. However, the use of thickening additives seems to reduce removal rates.

U.S. patent application Publication No. 2008/0135520 discloses CMP slurries for polishing silicon oxide or glass substrates that comprise low molecular weight polymers (MW<15,000 Daltons) and a silicate oligomer.

Typically, abrasives are used in most barrier CMP compositions (or slurries). The abrasives with variable particle size and shapes provide mechanical friction forces between polishing pad and wafer surface under applied pressure. When abrasives are used, especially with high concentration, abrasive damage (scratching) can occur. High abrasive particle concentration also creates more residue defects on wafer surface during polishing process. Abrasive particles are also one of the most expensive component of a CMP composition. Hence it is desired to produce high removal rates in the CMP compositions while using as little concentration of abrasive particles as possible.

Barrier compositions need to meet several stringent requirements including high barrier removal rates, very low post-polish topography, no corrosion defects and very low scratches or residue defects. Therefore, there are significant needs for barrier CMP compositions and processes that meet these stringent requirements as the semiconductor industry continues to move towards smaller and smaller feature sizes.

BRIEF SUMMARY OF THE INVENTION

Described herein are barrier CMP polishing compositions and methods for the CMP processing. In one aspect, the present invention provides a polishing composition comprising: water; an abrasive; a polymer selected from the group consisting of poly(acrylic acid), poly(meth-acrylic acid), poly(2-acrylamido-2-methyl-1-propanesulfonic acid), carboxymethyl cellulose, methyl cellulose, hydroxypropyl methyl cellulose, poly-(1-vinylpyrroliddone-co-2-dimethylaminoethyl methacrylate), poly(sodium 4-styrenesulfonate), poly(ethylene oxide), poly(4-sytrenesulfonic acid), polyacrylamide, poly(acrylamide/acrylic acid) copolymers, and combinations thereof, and salts thereof and wherein the polymer has a molecular weight of from 30,000 to 30,000,000 Daltons; a corrosion inhibitor; an inorganic silicate; an oxidizer; and, optionally, a surfactant; a pH-adjusting agent; a chelating agent, wherein the polishing composition has a pH of from about 9 to about 11.5, and wherein the viscosity of the polishing composition is from about 1.5 cP to about 10 cP.

In another aspect, the present invention provides a polishing method for chemical mechanical planarization of a semiconductor device comprising at least one surface, wherein the at least one surface has (1) a barrier layer selected from the group consisting of tantalum, tantalum nitride, tantalum tungsten silicon carbide, titanium, titanium nitride; (2) an interconnect metal layer selected from the group of copper, tungsten, cobalt, aluminum, ruthenium, or their alloys; and (3) a porous or non-porous dielectric layer, the method comprising the steps of: a. contacting the at least one surface with a polishing pad; b. delivering to the at least one surface the polishing composition as described herein, and c. polishing the at least one surface with the polishing composition to at least partially remove at least the barrier layer preferably over the dielectric layer.

In yet another aspect, the present invention provides a system for chemical mechanical planarization, comprising: a semiconductor device comprising at least one surface, wherein the at least one surface has (1) a barrier layer selected from the group consisting of tantalum, tantalum nitride, tantalum tungsten silicon carbide, titanium, titanium nitride; (2) an interconnect metal layer selected from the group of copper, tungsten, cobalt, aluminum, or their alloys; and (3) a porous or non-porous dielectric layer; a polishing pad; and a polishing composition as described herein, wherein the at least one surface is in contact with the polishing pad and the polishing composition.

DETAILED DESCRIPTION OF THE INVENTION

Described and disclosed herein are barrier CMP compositions, systems and methods for polishing. The compositions disclosed herein can boost the barrier film removal rates relative to dielectric layer removal rates, lower the abrasive concentration, and reduce defects during CMP processing. The barrier CMP compositions are used for chemical mechanical planarization of a surface of a semiconductor substrate having at least one feature thereon comprising conductive metal lines, vias or trenches, a metal-containing barrier layer and a dielectric layer.

The conductive metal lines can comprise, for example, copper, cobalt, tungsten, aluminum or their alloys. The barrier or liner layer for the interconnects can be a tantalum (Ta) containing barrier layer, such as tantalum or tantalum nitride or tantalum tungsten silicon carbide; a titanium (Ti) containing barrier layer, such as titanium or titanium nitride; a cobalt or self-forming manganese oxide layer; and other noble metals such as ruthenium. The dielectric layer can be TEOS, a porous or a non-porous low-K film comprising of silicon, carbon, nitrogen, oxygen and hydrogen, a porous low K material with a capping layer of a non-porous material.

Compositions of this invention allow polishing of barrier/liner films and the dielectric films at very high rates with low defects without needing substantially higher concentrations of abrasive particles.

Polishing compositions of the present invention comprise: water; an abrasive; a polymer selected from the group consisting of poly(acrylic acid), poly(meth-acrylic acid), poly(2-acrylamido-2-methyl-1-propanesulfonic acid, carboxymethyl cellulose, methyl cellulose, hydroxypropyl methyl cellulose, poly-(1-vinylpyrroliddone-co-2-dimethyl-aminoethyl methacrylate), poly(sodium 4-styrenesulfonate), poly(ethylene oxide), poly(4-sytrenesulfonic acid), poly-acrylamide, poly(acrylamide/acrylic acid) copolymers, and combinations thereof, and salts thereof, and wherein the polymer has a molecular weight of from 30,000 to 30,000,000 Daltons; a corrosion inhibitor; an inorganic silicate; an oxidizer; and, optionally, a surfactant; a pH-adjusting agent; a chelating agent, wherein the polishing composition has a pH of from about 9 to about 11.5, and wherein the viscosity of the polishing composition is from about 1.5 cP to about 10 cP. Preferred polymers have anionic or non-ionic nature at the pH of the slurry.

Compositions of the present invention provide removal rate improvements on all CMP pads. However, the removal rate increases are especially more effective on CMP pads with higher hardness. Hardness of the CMP pads is typically reported as Shore D hardness determined per ASTM D2240. CMP formulations of this invention are particularly well suited for CMP pads with shore hardness greater than 30, or more preferably greater than 40. Examples of such CMP pads include Visionpad™ 3500, 3100, 5000, 5200, 6000 from Dow Chemicals.

Water

The polishing compositions of the present invention are aqueous-based and, thus, comprise water. In the present invention, water functions in various ways such as, for example, to dissolve one or more solid components of the composition, as a carrier of the components, as an aid in the removal of polishing residue, and as a diluent. Preferably, the water employed in the cleaning composition is de-ionized (DI) water.

It is believed that, for most applications, water will comprise, for example, from about 10 to about 90% by wt. of water. Other preferred embodiments of the present invention could comprise from about 30 to about 95% by wt. of water. Yet other preferred embodiments of the present invention could comprise from about 50 to about 90% by wt. of water. Still other preferred embodiments of the present invention could include water in an amount to achieve the desired weight percent of the other ingredients.

Abrasive

The polishing compositions of the present invention comprise an abrasive. Suitable abrasives for polishing compositions are nano-sized particles include, but are not limited to, nano-sized colloidal silica or high purity colloidal silica particles; nano-sized inorganic metal oxide particles, such as alumina, titania, zirconia, ceria, and combinations thereof; nano-sized diamond particles; nano-sized silicon nitride particles; mono-modal, bi-modal, or multi-modal colloidal abrasive particles; organic polymer-based soft abrasives; surface-coated or modified abrasives; and combinations thereof.

The surface-coated or modified abrasives include but are not limited to the colloidal silica particles doped by other metal oxide within lattice of the colloidal silica, such as alumina doped silica particles, colloidal aluminum oxide, which include alpha-, beta-, and gamma-types of aluminum oxides, colloidal and photoactive titanium dioxide, cerium oxide, colloidal cerium oxide, nano-sized diamond particles, nano-sized silicon nitride particles, mono-modal, bi-modal, multi-modal colloidal abrasive particles, zirconium oxide, organic polymer-based soft abrasives, surface-coated or modified abrasives, and mixtures thereof.

The nano-sized particles have narrow or broad particle size distributions, various sizes and various shapes. The various shapes of the abrasives include spherical shape, cocoon shape, aggregate shape and other shapes.

Preferred abrasives include, but are not limited to, high purity colloidal silica, alumina, ceria, germania, silica, titania, zirconia, alumina dopes colloidal silica in lattices, and mixtures thereof. Colloidal silica is most a preferred abrasive particle.

It is preferred that the mean particle size of the abrasive as measured by Disc Centrifuge (DC) particle sizing method is between 20 nm and 300 nm, or more preferably between 30 nm and 200 nm, and even more preferably between 40 nm and 100 nm. In some preferred embodiments, the size distribution of particles as measured by Disc Centrifuge analysis method is multi-modal. In preferred embodiments, the particle size distribution of the abrasive particles show at least two distinct peaks in the particle size range of 30 nm to 120 nm. More preferably, there are at least three distinct peaks in the particle size range of 30 nm to 120 nm.

Typically, the abrasive is present in the compositions of the present invention in an amount ranging from about 0.1% to about 20% relative to the total weight of the CMP composition. The preferred range is from about 3% to about 15% by weight.

Inorganic Silicate

The compositions of the present invention also comprise an inorganic silicate. The inorganic silicate functions at least in part to increase the removal rate of a barrier or liner layers, dielectric layers relative to the conductive metal lines. Suitable inorganic silicate compounds include, for example, salts of silicic acids such as, for example, potassium silicate, ammonium silicate, tetramethylammonium silicate, tetrabutylammonium silicate, tetraethylammonium silicate, and combinations thereof. These silicate compounds preferably exist in the CMP compositions in stable and mostly soluble form.

The amount of soluble silicate salt in the CMP compositions ranges from about 0.01 wt. % to about 10 wt. % relative to the total weight of the CMP composition, more preferably between about 0.1 wt. % and about 5 wt. %, and most preferably between about 0.2 wt. % and 2.0 wt. %.

High Molecular Weight Polymer

The polymer/copolymer has molecular weights greater than 10,000, ranging preferably from 10,000 to 20,000,000 Daltons, more preferably from 30,000 to 10,000,000 Daltons, and most preferably between 50,000 and 8,000,000 Daltons. High molecular weight polymers can be selected from a group of polymers including, but not limited to poly(acrylic acid), poly(meth-acrylic acid), poly(2-acrylamido-2-methyl-1-propanesulfonic acid, carboxymethyl cellulose, methyl cellulose, hydroxypropyl methyl cellulose, poly-(1-vinylpyrroliddone-co-2-dimethylaminoethyl methacrylate), polyacrylamide, poly-styrene sulfonic acid, copolymers of polyacrylamide and polyacrylic acid, poly(2-ethyl-oxazoline), and polyethylene oxide.

Molecular weight of the species can be measured by any suitable techniques Some of the most common methods for determining these parameters are colligative property measurements, static light scattering techniques, viscometry, and size exclusion chromatography. Viscometry and gel permeation chromatography (GPC) are most common techniques for characterizing molecular weight of the polymers.

Preferably, the high molecular weight polymer is present in the compositions in a range of from 0.0001 wt. % to about 2.0 wt. % relative to the total weight of the CMP composition. A preferred range is from about 0.01 wt. % to about 1.0 wt. %, and an even more preferred concentration range is from about 0.1 wt. % to about 0.5 wt. %.

A synergistic effect has been observed between the inorganic silicate component and the high molecular weight component in terms of the viscosity of the polishing composition as used and in terms of an increased removal rate of a barrier layer and dielectric layer. One hypothesis for increased removal rate from use of polymeric and silicate additives is the increased of viscosity of the slurry with these additives. However, substantial increase in viscosity may create issues such as poor slurry flow during polishing and poor filterability. Preferably the viscosity of the slurry is between 1.2 cP and 15 cP; or more preferably between 1.5 cP and 10 CP or most preferably between 2 and 8 cP.

Oxidizer

The polishing compositions of the present invention include an oxidizing agent, also referred to as an "oxidizer." The oxidizing agent can be any suitable oxidizing agent. Suitable oxidizing agents include, but are not limited to, one or more peroxy-compounds, which comprise at least one peroxy group (—O—O—). Suitable peroxy-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., iodates, periodates, and acids thereof, and mixtures thereof, and the like), perboric acid, perborates, percarbonates, peroxyacids (e.g., peracetic acid, perbenzoic acid, salts thereof, mixtures thereof, and the like), permanganates, cerium compounds, ferricyanides (e.g., potassium ferricyanide), mixtures thereof, and the like.

In some embodiments, preferred oxidizing agents include, but are not limited to, hydrogen peroxide, periodic acid, potassium iodate, potassium permanganate, ammonium persulfate, ammonium molybdate, ferric nitrate, nitric acid, potassium nitrate, ammonia, and mixtures thereof. In still other embodiments, preferred oxidizing agents include hydrogen peroxide and urea-hydrogen peroxide.

The amount of oxidizing agent ranges from about 0.01% to about 10% relative to the total weight of the CMP composition. The preferred range is about 0.1% to about 3%.

Corrosion Inhibitor

The polishing composition of the present invention also comprises a corrosion inhibitor to, in part, protect the metal lines exposed on the surface of a wafer. Suitable corrosion inhibitors include, but are not limited to, benzotriazole (BTA) or BTA derivatives, 3-amino-1, 2, 4-triazole, 3, 5-diamine-1, 2, 4-triazole, other triazole derivatives, and combinations thereof.

The amount of corrosion inhibitor preferably ranges from 0.001 wt. % to about 1.0 wt. % relative to the total weight of the composition. The preferred range is from about 0.01 wt. % to about 0.1 wt. %.

The following components may optionally be present in the compositions of the present invention. One of ordinary skill in the art will understand whether and under what particular circumstances such components may be included.

Surfactant (Optional)

The compositions of the present invention optionally comprise a surfactant, which, in part, aids in protecting the wafer surface during and after polishing to reduce defects in the wafer surface. Surfactants may also be used to control the removal rates of some of the films used in polishing such as low-K dielectrics. Suitable surfactants include non-ionic surfactants, anionic surfactants, cationic surfactants, ampholytic surfactants, and mixtures thereof.

Non-ionic surfactants may be chosen from a range of chemical types including but not limited to long chain alcohols, ethoxylated alcohols, ethoxylated acetylenic diol surfactants, polyethylene glycol alkyl ethers, proplylene glycol alkyl ethers, glucoside alkyl ethers, polyethylene glycol octylphenyl ethers, polyethylene glycol alkylpgenyl ethers, glycerol alkyl esters, polyoxyethylene glycol sorbiton alkyl esters, sorbiton alkyl esters, cocamide monoethanol amine, cocamide diethanol amine dodecyl dimethylamine oxide, block copolymers of polyethylene glycol and polypropylene glycol, polyethoxylated tallow amines, fluorosurfactants. The molecular weight of surfactants may range from several hundreds to over 1 million. The viscosities of these materials also possess a very broad distribution.

Anionic surfactants include, but are not limited to salts with suitable hydrophobic tails, such as alkyl carboxylate, alkyl polyacrylic salt, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy bisulfate, alkoxy biphosphate, such as substituted aryl carboxylate, substituted aryl sulfate, substituted aryl phosphate, substituted aryl bicarboxylate, substituted aryl bisulfate, and substituted aryl biphosphate etc. The counter ions for this type of surfactants include, but are not limited to potassium, ammonium and other positive ions. The molecular weights of these anionic surface wetting agents range from several hundred to several hundred-thousand.

Cationic surfactants possess the positive net charge on major part of molecular frame. Cationic surfactants are typically halides of molecules comprising hydrophobic chain and cationic charge centers such as amines, quaternary ammonium, benzyalkonium, and alkylpyridinium ions.

In another aspect, the surfactant can be an ampholytic surfactant, which possess both positive (cationic) and negative (anionic) charges on the main molecular chains and with their relative counter ions. The cationic part is based on primary, secondary, or tertiary amines or quaternary ammonium cations. The anionic part can be more variable and include sulfonates, as in the sultaines CHAPS (3-[(3-Cholamidopropyl)dimethylammonio]-1-propanesulfonate) and cocamidopropyl hydroxysultaine. Betaines such as cocamidopropyl betaine have a carboxylate with the ammonium. Some of the ampholytic surfactants may have a phosphate anion with an amine or ammonium, such as the phospholipids phosphatidylserine, phosphatidylethanolamine, phosphatidylcholine, and sphingomyelins.

Examples of surfactants also include, but are not limited to, dodecyl sulfate sodium salt, sodium lauryl sulfate, dodecyl sulfate ammonium salt, secondary alkane sulfonates, alcohol ethoxylate, acetylenic surfactant, and any combination thereof. Examples of suitable commercially available surfactants include TRITON™, Tergitol™, DOWFAX™ family of surfactants manufactured by Dow Chemicals and various surfactants in SURFYNOL™, DYNOL™, Zetasperse™, Nonidet™, and Tomadol™ surfactant families, manufactured by Air Products and Chemicals. Suitable surfactants of surfactants may also include polymers comprising ethylene oxide (EO) and propylene oxide (PO) groups. An example of EO-PO polymer is Tetronic™ 90R4 from BASF Chemicals.

When employed, the amount of surfactant typically ranges from 0.0001 wt. % to about 1.0 wt % relative to the total weight of the barrier CMP composition. When employed, the preferred range is from about 0.010 wt. % to about 0.1 wt. %.

pH Adjusting Agent (Optional)

Compositions of the present invention comprise pH adjusting agents. A pH adjusting agent is typically employed in the composition of the present invention to raise or lower the pH of the polishing composition. The pH-adjusting agent may be used to improve the stability of the polishing composition, to tune the ionic strength of the polishing composition, and to improve the safety in handling and use, as needed.

Suitable pH-adjusting agents to lower the pH of the polishing composition include, but are not limited to, nitric acid, sulfuric acid, tartaric acid, succinic acid, citric acid, malic acid, malonic acid, various fatty acids, various polycarboxylic acids and mixtures thereof. Suitable pH-adjusting agents to raise the pH of the polishing composition include, but are not limited to, potassium hydroxide, sodium hydroxide, ammonia, tetraethylammonium hydroxide, ethylenediamine, piperazine, polyethyleneimine, modified polyethyleneimine, and mixtures thereof.

When employed, the amount of pH-adjusting agent preferably ranges from 0.0001 wt. % to about 5.0 wt. % relative to the total weight of the polishing composition. The preferred range is from about 0.01 wt. % to about 1 wt. %.

Preferably, the pH of the composition of the present invention ranges from about 2 to about 12, preferably from about 7 to about 11.5, and more preferably from about 9 to about 11.5.

Chelating Agent (Optional)

Chelating agents may optionally be employed in the compositions of the present invention to enhance affinity of chelating ligands for metal cations. Chelating agents may also be used to prevent build-up of metal ions on pads which causes pad staining and instability in removal rates. Suitable chelating agents include, but are not limited to, for example, amine compounds such as ethylene diamine, amino polycarboxylic acids such as ethylene diamine tetraacetic acid (EDTA), nitrilotriacetic acid (NTA); aromatic acids such as benzenesulfonic acid, 4-tolyl sulfonic acid, 2,4-diaminobenzosulfonic acid, and etc.; non-aromatic organic acids, such as itaconic acid, malic acid, malonic acid, tartaric acid, citric acid, oxalic acid, gluconic acid, lactic acid, mandelic acid, or salts thereof; various amino acids and their derivatives such as Glycine, Serine, Proline, Histidine, Isoleucine, Leucine, Lysine, Methionine, Phenylalanine, Threonine, Tryptophan, Valine, Arginine, Asparagine, Aspartic acid, cystein, Glutamic acid, Glutamine, Ornithine, Selenocystein, Tyrosine, Sarcosine, Bicine, Tricine, Aceglutamide, N-Acetylaspartic acid, Acetylcarnitine, Acetylcysteine, N-Acetylglutamic acid, Acetylleucine, Acivicin, S-Adenosyl-L-homocysteine, Agaritine, Alanosine, Aminohippuric acid, L-Arginine ethyl ester, Aspartame, Aspartylglucosamine, Benzylmercapturic acid, Biocytin, Brivanib alaninate, Carbocisteine, N(6)-Carboxymethyllysine, Carglumic acid, Cilastatin, Citiolone, Coprine, Dibromotyrosine, Dihydroxyphenylglycine, Eflornithine, Fenclonine, 4-Fluoro-L-threonine, N-Formylmethionine, Gamma-L-Glutamyl-L-cysteine, 4-(γ-Glutamylamino)butanoic acid, Glutaurine, Glycocyamine, Hadacidin, Hepapressin, Lisinopril, Lymecycline, N-Methyl-D-aspartic acid, N-Methyl-L-glutamic acid, Milacemide, Nitrosoproline, Nocardicin A, Nopaline, Octopine, Ombrabulin, Opine, Orthanilic acid, Oxaceprol, Polylysine, Remacemide, Salicyluric acid, Silk amino acid, Stampidine, Tabtoxin, Tetrazolylglycine, Thiorphan, Thymectacin, Tiopronin, Tryptophan tryptophylquinone, Valaciclovir, Valganciclovir, and phosphonic acid and its derivatives such as, for example, octylphosphonic acid, aminobenzylphosphonic acid, and combinations thereof and salts thereof.

Chelating agents may be employed where there is a need to chemically bond, for example, copper cations and tantalum cations to accelerate the dissolution of copper oxide and tantalum oxide to yield the desirable removal rates of copper lines, vias, or trenches and barrier layer, or barrier films.

When employed, the amount of chelating agent preferably ranges from about 0.01 wt. % to about 3.0 wt. % relative to the total weight of the composition and, more preferably, from about 0.4 wt. % to about 1.5 wt. %.

Biocide (Optional)

CMP formulations may also comprise additives to control biological growth such as biocides. Some of the additives to control biological growth are disclosed in U.S. Pat. No. 5,230,833 (Romberger et al.) and U.S. patent application Publication No. 2002/0025762, which is incorporated herein by reference. Biological growth inhibitors include but are not limited to tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, sodium hypochlorite, isothiazolinone compounds such as methylisothiazolinone, methylchloroisothiazolinone and benzisothiazolinone. Some of the commercially available preservatives include KATHON™ and NEOLENE™ product families from Dow Chemicals and Preventol™ family from Lanxess.

The preferred biocides are isothiozilone compounds such as methylisothiazolinone, methylchloroisothiazolinone and benzisothiazolinone The CMP polishing compositions optionally contain a biocide ranging from 0.0001 wt. % to 0.10 wt. %, preferably from 0.0001 wt. % to 0.005 wt. %, and more preferably from 0.0002 wt. % to 0.0025 wt. % to prevent bacterial and fungal growth during storage.

In some embodiments, the described barrier polishing compositions for barrier CMP processing, comprise a corrosion inhibitor such as BTA or BTA derivatives, triazole or triazole derivatives; more specifically, such as 3-amino-1,2,4-triazole, 3,5-diamino-1,2,4-triaozle or others; a or chelating ligand such as benzenesulfonic acid or potassium citrate; a surface wetting agent such as Carbowet 13-40 and Dynol 607; an organic polymer with molecular weight greater than 10,000, a silicate compound; an abrasive; a pH-adjusting agent and an oxidizing agent. Such compositions have been successfully used in the present invention as barrier CMP polishing compositions for the advanced node applications, and provided the desirable removal rates in polishing multi-type films and the desirable selectivity.

Compositions of this invention may be manufactured in a concentrated form and subsequently diluted at the point of use with DI water. Other components such as, for example, the oxidizer, may be withheld in the concentrate form and added at the point of use to minimize incompatibilities between components in the concentrate form. The compositions of the present invention may be manufactured in two or more components which can be mixed prior to use.

When used for barrier CMP, these compositions can be used for the step of the process where the barrier and the dielectric films are polished at higher rates compared to the metal lines. In some embodiments, the barrier chemical mechanical polishing composition is effective for use in the second stage of chemical mechanical polishing of the patterned wafers and provides at least one of the following: affords a desirable removal rates of various types of film, affords a desirable low level of within a wafer non-uniformity ("WIW NU %"), results in low residue level(s) being present on the polished wafer(s) subsequent to CMP processing, and affords desirable selectivity among various films.

A specific feature distortion that is undesirable for semiconductor manufacturing is the damages to copper vias or metal lines caused by the further corrosion of chemical components interacting with copper vias or metal lines in a chemical mechanical polishing process. Therefore, it is very important to use a corrosion inhibitor in barrier CMP compositions to reduce and control further corrosion of copper vias or trenches during chemical mechanical polishing processes, and to reduce the defects.

For the barrier removal step of a typical CMP process, the chemical reactions involved in using a barrier CMP composition include oxidation reactions induced by the oxidant used in the barrier CMP composition, for example, $H_2O_2$. The surfaces of metals lines, vias or trenches, and barrier material, such as Ta, are oxidized into the relative metal oxide films. Typically, metallic copper is oxidized into a mixture of cuprous and cupric oxides, and Ta is oxidized to $Ta_2O_5$ (the preferred oxide form for Ta).

In preferred embodiments, the removal rates of the TEOS dielectric films at 3 psi down-force and 135 RPM table speed is more than 1500 Å/min, TaN removal rate is more than 900 Å/min and copper removal rate is more than 400 Å/min using a CMP pad with Shore D hardness greater than 40.

In preferred embodiments, the removal rates of the TEOS dielectric films at 3 psi down-force is more than 1500 Å/min, TaN removal rate is more than 900 Å/min and copper removal rate is more than 400 Å/min.

In certain preferred embodiments, the removal rates of Cu, TaN and TEOS films with the addition of silicate compound and the polymer is at-least 1.25 times higher compared to compositions without these additives.

A polishing slurry of this invention may be prepared by a common process for preparing a free-grain aqueous polishing slurry composition. Specifically, to an aqueous solvent are added a proper amount of polishing grain (polishing material particles) and, if necessary, a proper amount of a dispersing agent. In such a state, the grains are aggregated. Thus, the aggregated polishing material particles are dispersed into particles with a desired particle size by conducting dispersion of the polishing grain mixture. In such a dispersion process, an appropriate apparatus may be used, including an ultrasonic disperser, a bead mill, a kneader and a ball mill. A thickener in this invention may be added before or after the dispersion process.

A typical CMP process employing a polishing slurry of this invention may be conducted, using, for example a procedure described below. First, a substrate is prepared, on which an insulating film is formed, a concave with a given pattern is formed on the insulating film and a metal film is deposited on the concave. The substrate is placed on a wafer carrier such as a spindle. The metal film surface of the substrate is contacted with a polishing pad attached on a surface plate such as a rotary plate, under a given pressure. While supplying a polishing slurry between the substrate and the polishing pad, polishing is initiated by relatively moving the substrate (wafer) and the polishing pad (e.g., rotating both). The polishing slurry may be supplied on the polishing pad from a separate supply pipe or from the surface plate side. If necessary, a pad conditioner is contacted with the surface of the polishing pad to condition the surface of the polishing pad.

A polishing slurry of this invention described above may be most effectively used when polishing by CMP is conducted to a substrate in which a barrier or liner metal film is deposited on an insulating film comprising a concave such as a trench and a connection hole and a conductive metal film is formed over the whole surface while filling the concave with the metal, to form an electric connection such as a damascene interconnect, a via plug and a contact plug. Examples of an insulating film include a silicon oxide film, a BPSG film and an SOG film. Examples of a conductive metal film include those made of copper, silver, gold, platinum, titanium, tungsten, aluminum, ruthenium, and alloys thereof. Examples of a barrier metal film include those made of a tantalum-based metal such as tantalum (Ta), tantalum nitride and tantalum nitride silicon; a titanium-based metal such as titanium (Ti) and titanium nitride; a tungsten-based metal such as tungsten (W), tungsten nitride and tungsten nitride silicon. Among others, a polishing slurry of this invention may be more effectively used when a conductive metal film is a copper-based metal film (a copper film or a copper alloy film comprising copper as a main component). In particular, the slurry may be effectively used when the conductive metal film is a copper-based metal film and the barrier metal film is a tantalum-based metal film.

Thus, the present invention also provides a system for chemical mechanical planarization, comprising: a semiconductor device comprising at least one surface, wherein the at least one surface has (1) a barrier layer selected from the group consisting of tantalum, tantalum nitride, tantalum tungsten silicon carbide, titanium, titanium nitride; (2) an interconnect metal layer selected from the group of copper, tungsten, cobalt, aluminum, or their alloys; and (3) a porous or non-porous dielectric layer; a polishing pad; and a polishing composition as described herein, wherein the at least one surface is in contact with the polishing pad and the polishing composition. The polishing compositions and methods described herein will be illustrated in more detail with reference to the following examples, but it should be understood that it is not deemed to be limited thereto.

WORKING EXAMPLES

General Experimental Procedure

All percentages are weight percentages unless otherwise indicated. In the examples presented below, CMP experiments were run using the procedures and experimental conditions given below.

The CMP tool that was used in the examples is a Mirra®, manufactured by Applied Materials, 3050 Boweres Avenue, Santa Clara, Calif., 95054. Polishing was performed on VP3500 polisher pad from Dow Chemicals. Polishing was performed at 3 psi down force and 135 RPM table speed with 200 ml/min composition flow rates. Polishing experiments were conducted using electroplating deposited copper, plasma enhanced deposition of tetraethoxy silane (TEOS) dielectric, Tantalum (Ta) and Tantalum Nitride (TaN) films. These blanket wafers were purchased from Silicon Valley Microelectronics, 1150 Campbell Ave, CA, 95126, and Advantiv Corporation. Defects on the wafer films were measured using Surfscan SP2 wafer inspection tool, manufactured by KLA-Tencor, One Technology Drive, Milpitas, Calif. 95035.

Polymers used in the subsequent examples have been purchased from various suppliers as identified in the examples. Molecular weight information has been based on catalog information from suppliers. Typically, molecular weight information is reported in Daltons and are based on viscosity measurement techniques.

Example 1

All the compositions in this and the subsequent examples were made using colloidal silica particles with mean particle size as measured by Disc Centrifuge method (DC24000 UHR from CPS Instruments) in the range of 65-75 nm.

A control composition was made with composition described in table I.

TABLE I

Control Composition

|  | Concentration (wt %) |
|---|---|
| Benzotriazole | 0.01963 |
| Dynol ™ 607 | 0.00518 |
| Carbowet ® 13-40 | 0.015 |
| Potassium Citrate Tribasic | 0.1 |
| Colloidal Silica | 10.345 |
| Potassium Silicate | 1 |
| DI Water | Balance |

Table 2 provided the information on the additives used.

TABLE 2

Effect of additives on removal rates and defects

| Polymer | Chemical name | Molecular Weight | Supplier information |
|---|---|---|---|
| A1 | Poly (2-acrylamido-2-methyl-1-propanesulfonic acid) | 2,000,000 | Sigma-Aldrich |
| A2 | Poly(1-vinylpyrrolidone-co-dimethylaminoethyl methacrylate (A2) | 1,000,000 | Sigma-Aldrich |
| A3 | Polyacrylic acid (A3) | 100,000 | Sigma-Aldrich |
| A4 | Polyacrylic acid (High Purity) (A4) | 100,000 | Polysciences |
| A5 | Methyl Cellulose |  | Sigma-Aldrich |
| A6 | Carboxymethyl Cellulose |  | Sigma-Aldrich |
| A7 | Poly(acrylic acid) | 1,250,000 | Sigma Aldrich |

Table 3 summarized the impact of additives added to the compositions on defects and removal rates.

TABLE 3

Impact of Additives on removal rates and defects

| Composition # | Additive | Additive Concentration (wt %) | TEOS RR (Å/min) | Cu RR (Å/min) | Ta RR (Å/min) | TaN RR (Å/min) | Cu Defect Adders | TEOS Defect Adders |
|---|---|---|---|---|---|---|---|---|
| 1 | None | 0 | 947 | 631 | 703 | 751 | 2142 | 326 |
| 2 | A1 | 0.2 | 1862 | 1402 | 1283 | 1453 | 687 | 276 |
| 3 | A1 | 0.4 | 1902 | 1369 | 1296 | 1473 | 617 | 399 |
| 4 | A2 | 0.2 | 1671 | 1088 | 1082 | 1339 | 1598 | 55 |
| 5 | A3 | 0.3 | 1912 | 1374 | 1251 | 1254 | 1170 | 58 |
| 6 | A4 | 0.3 | 1873 | 1462 | 1233 | 1487 | 1130 | 72 |
| 7 | A5 | 0.2 | 1684 | 1260 | 1199 | 1345 | 3015 | 487 |
| 8 | A6 | 0.1 | 1888 | 1346 | 1318 | 1407 | 1887 | 251 |
| 9 | A7 | 0.1 | 1605 | 1155 | 1043 | 1101 | 20000 | 1501 |

As shown in table 3, all compositions with added additives achieved up to 2× increase in removal rate leading to twice the wafer throughput and a reduction in defects of up to 5×. The composition with the added additives, barring A5 and A7, were able to reduce the defects on Cu and TEOS wafers compared to control composition without any additives.

The data also has shown that higher concentration of A1 did not improve the additive effect as the removal rates and defects were almost identical for 0.2 and 0.4 wt % additive concentration.

Interestingly also was that adding A5 to the composition did provide a significant rate boost though less than A1 or A2 but it did not provide any improvement in defects.

Example 2

CMP compositions were made by adding different polymeric additives in different concentrations to the composition listed in table 1. Viscosity of these formulations were measured with Brookfield Model: DV-II+ Viscometer at 25° C. at 60 RPM spindle speed.

TABLE 4

Viscosity of CMP slurry formulations with Different Polymeric Additives

| Concentration | Viscosity (cP) | | |
|---|---|---|---|
| (wt %) | A3 | A1 | A4 |
| 0 | 1.2 | 1.2 | 1.2 |
| 0.1 | 1.41 | 1.81 | 1.66 |
| 0.2 | 1.67 | 2.57 | 2.26 |
| 0.3 | 2.05 | 3.54 | 3.22 |

It's evident that the polymer addition resulted in increased viscosity. Viscosity increase was higher with higher molecular weight polymer (A1).

Example 3

CMP compositions were made with different concentrations of potassium silicate, additive A1 and silica particle loading to determine relative influence of each component in boosting the removal rates.

Control composition (composition #10) comprised only 10 wt % silica and water.

The removal rates for Cu, Ta, TaN, and TEOS films using different CMP compositions #11 to #18 were shown in Table 5.

A synergy effect was observed by adding additive A1 and potassium silicate together to the control composition: the removal rates was boosted.

Comparing the compositions 11 and 12, the removal rate boost was relatively small or none by increasing A1 concentration from 0.1 wt. % to 0.3 wt. %, when potassium silicate concentration was low (0.2 wt. %) for the compositions comprising 10 wt. % or 4 wt. % of silica abrasive loading.

However, for compositions comprising high potassium silicate concentrations (1 wt. % in #13 and 14), removal rate boost was quite substantial when A1 concentration increased from 0.1 to 0.3 wt. %.

The removal rate boost was even more pronounced for compositions with 4 wt % silica abrasive loading, where removal rates were boosted 1.5 times or more when A1 concentration was increased from 0.1 wt. % to 0.3 wt. % with 1 wt. % potassium silicate in the compositions.

TABLE 5

Effect of component concentration on removal rates

| # | Silica (wt %) | Potassium Silicate Concentration (wt %) | A1 Concentration (wt %) | TEOS RR (Å/min) | Cu RR (Å/min) | Ta RR (Å/min) | TaN RR (Å/min) |
|---|---|---|---|---|---|---|---|
| 10 | 10 | 0 | 0 | 823 | 592 | 736 | 804 |
| 11 | 10 | 0.2 | 0.1 | 1262 | 849 | 782 | 1008 |
| 12 | 10 | 0.2 | 0.3 | 1335 | 973 | 964 | 1200 |
| 13 | 10 | 1 | 0.1 | 1581 | 1173 | 995 | 1223 |
| 14 | 10 | 1 | 0.3 | 1849 | 1365 | 1282 | 1566 |
| 15 | 4 | 0.2 | 0.1 | 363 | 276 | 355 | 400 |
| 16 | 4 | 0.2 | 0.3 | 329 | 262 | 435 | 564 |
| 17 | 4 | 1 | 0.1 | 581 | 496 | 482 | 614 |
| 18 | 4 | 1 | 0.3 | 950 | 754 | 627 | 821 |

Example 4

CMP compositions were made by adding different polymeric additives at 0.2 wt % concentration to the control composition described in table 1. The formulations 19-23 also comprised 1 wt % potassium silicate. The pH of the formulations was about approximately 10.7.

TABLE 6

Effect of Molecular Weight of Polymer on Removal Rate

| | | Molecular Weight Information from Supplier | Supplier | Removal Rates (Angstroms/min) | | | | TEOS Removal Rate Relative to Control |
|---|---|---|---|---|---|---|---|---|
| | | | | Ta | TaN | Cu | TEOS | |
| | Control (Table I) | | | 502 | 610 | 491 | 746 | 1 |
| 18 | Polyacrylic Acid | ~30,0000 | PolySciences Inc | 733 | 833 | 826 | 1177 | 1.58 |
| 19 | Polyacrylic Acid | ~100,000 | PolySciences Inc | 1087 | 1227 | 1081 | 1715 | 2.30 |
| 20 | Poly(4-sytrenesulfonic acid) | ~75,000 | Sigma-Aldrich | 656 | 723 | 712 | 1052 | 1.41 |
| 21 | Poly(sodium 4-styrenesulfonate) | 1,000,000 | Sigma-Aldrich | 801 | 881 | 899 | 1304 | 1.75 |
| 22 | Poly(ethylene oxide), MW 400,000 | 1,000,000 | Sigma-Aldrich | 1017 | 1142 | 989 | 1757 | 2.35 |

It is evident from this table that the higher molecular weight polymers are more effective in increasing removal rates of all the films.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:
1. A polishing composition consisting essentially of:
water;
an abrasive selected from the group consisting of high purity colloidal silica, alumina, ceria, germania, silica, titania alumina dopes colloidal silica in lattices, and combinations thereof;
a polymer selected from the group consisting of poly (acrylic acid), poly(meth-acrylic acid), poly(2-acrylamido-2-methyl-1-propanesulfonic acid, carboxymethyl cellulose, methyl cellulose, hydroxypropyl methyl cellulose, poly-(1-vinylpyrroliddone-co-2-dimethylaminoethyl methacrylate), poly(sodium 4-styrenesulfonate), poly(ethylene oxide), poly(4-sytrenesulfo- nic acid), polyacrylamide, poly(acrylamide/acrylic acid) copolymers, and combinations thereof, and salts thereof and wherein the polymer has a molecular weight of from 30,000 to 30,000,000 Daltons;

a corrosion inhibitor;
an inorganic silicate;
an oxidizer; and, optionally,
   a surfactant;
   a pH-adjusting agent;
   a chelating agent, wherein the polishing composition has a pH of from about 7 to about 11.5, and
wherein the viscosity of the polishing composition is from about 1.5 cP to about 10 cP.

2. The polishing composition of claim 1, wherein the inorganic silicate is a salt of silicic acid selected from the group consisting of potassium silicate, ammonium silicate, tetramethylammonium silicate, tetrabutylammonium silicate, tetraethylammonium silicate, and combinations thereof.

3. The polishing composition of claim 2, wherein the inorganic silicate is present in an amount of from about 0.2 wt. % to about 2 wt. %.

4. The polishing composition of claim 1, wherein the high molecular weight polymer is present in an amount of from about 0.01 wt. % to about 1.0 wt. %.

5. The polishing composition of claim 4, wherein the high molecular weight polymer is present in an amount of from about 0.1 wt. % to about 0.5 wt. %.

6. The polishing composition of claim 1, wherein the abrasive is present in an amount of from about 3 wt. % to about 15 wt. %.

7. The polishing composition of claim 6, wherein the abrasives is colloidal silica and the colloidal silica has a mean particle size of between 30 nm and 300 nm.

8. The polishing composition of claim 7, wherein the colloidal silica has a mean particle size of between 50 nm and 200 nm.

9. The polishing composition of claim 8, wherein the colloidal silica has a mean particle size of between 60 nm and 150 nm.

10. The polishing composition of claim 7, wherein the colloidal silica has a particle size distribution with at least two distinct peaks between 30 nm and 120 nm.

11. The polishing composition of claim 7, wherein the colloidal silica has a particle size distribution with at least three distinct peaks between 30 nm and 120 nm.

12. The polishing composition of claim 1, wherein the corrosion inhibitor is selected from the group consisting of benzotriazole, 3-amino-1, 2, 4-triazole, 3, 5-diamine-1, 2, 4-triazole, and combinations thereof; and the corrosion inhibitor is present in an amount of from about 0.01 wt. % to about 0.1 wt. %.

13. The polishing composition of claim 1, wherein the pH-adjusting agent is present and is selected from the group consisting of nitric acid, sulfuric acid, tartaric acid, succinic acid, citric acid, malic acid, malonic acid, various fatty acids, various polycarboxylic acids and combinations thereof.

14. The polishing composition of claim 1, wherein the pH-adjusting agent is present and is selected from the group consisting of potassium hydroxide, sodium hydroxide, ammonia, tetraethylammonium hydroxide, ethylenediamine, piperazine, polyethyleneimine, modified polyethyleneimine, and combinations thereof.

15. The polishing composition of claim 1, wherein the pH-adjusting agent is present in an amount ranging from about 0.0001 wt. % to about 2 wt. %.

16. The polishing composition of claim 1, wherein the chelating agent is present and is selected from the group consisting of potassium citrate, benzosulfonic acid, 4-tolyl sulfonic acid, 2,4-diamino-benzosulfonic acid, and malonic acid, itaconic acid, malic acid, tartaric acid, citric acid, oxalic acid, gluconic acid, lactic acid, mandelic acid, amino acids, polycarboxy amino acids, phosphonic acids and combinations thereof and salts thereof.

17. The polishing composition of claim 1, wherein the chelating agent is present in an amount ranging from about 0.01 wt. % to about 3.0 wt. %.

18. The polishing composition of claim 1, wherein the surfactant is selected from the group consisting of a nonionic surfactant, an anionic surfactant, a cationic surfactant, an ampholytic surfactant, and combinations thereof.

19. The polishing composition of claim 1, wherein the surfactant is present in an amount of from about 0.010 wt. % to about 0.1 wt. %.

20. The polishing composition of claim 19, wherein the surfactant is selected from the group consisting of an acetylenic diol surfactant, an alcohol ethoxylate surfactant, and a combination thereof.

21. The polishing composition of claim 1, wherein the oxidizer is selected from the group consisting of a peroxy compound, an oxidized halide, perboric acid, a perborate, a percarbonate, a permanganate, a cerium compound, a ferricyanide, and combinations thereof.

22. The polishing composition of claim 21, wherein the oxidizer is present in an amount of from about 0.5 wt. % to about 2.0 wt. %.

23. A polishing method for chemical mechanical planarization of a semiconductor device comprising at least one surface, wherein the at least one surface has (1) a barrier layer selected from the group consisting of tantalum, tantalum nitride, tantalum tungsten silicon carbide, titanium, titanium nitride; (2) an interconnect metal layer selected from the group of copper, tungsten, cobalt, aluminum, or their alloys; and (3) a porous or non-porous dielectric layer, the method comprising the steps of:
   a. contacting the at least one surface with a polishing pad;
   b. delivering to the at least one surface the polishing composition of claim 1, and
   c. polishing the at least one surface with the polishing composition to at least partially remove at least the barrier layer preferably over the dielectric layer.

24. The polishing method of claim 23 wherein the porous or non-porous dielectric layer comprises silicon, carbon, oxygen and hydrogen.

25. The polishing method of claim 24 wherein the porous or non-porous dielectric layer is TEOS.

26. The polishing method of claim 24 wherein the porous or non-porous dielectric layer further comprises a capping layer of a non-porous material.

27. The polishing method of claim 23, wherein removal rate selectivity between the barrier layer to the dielectric layer ranges between 0.25 to 4.

28. The polishing method of claim 27, wherein removal rate selectivity between the barrier layer to the dielectric layer ranges between 0.5 and 2.

29. The polishing method of claim 23, wherein removal rate selectivity between the interconnect metal layer and the dielectric layer rages between 0.25 and 4.

30. The polishing method of claim 29, wherein removal rate selectivity between the interconnect metal layer and the dielectric layer rages between 0.5 and 2.

31. The polishing method of claim 25, wherein removal rate of the TEOS at 3 psi down-force is more than 1500 Å/min.

32. The polishing method of claim 23, wherein the barrier layer is tantalum nitride (TaN) and the removal rate of TaN is more than 900 Å/min. at 3 psi down force.

33. The polishing method of claim 23 wherein the interconnect metal layer comprises copper and the copper removal rate is more than 400 Å/min at 3 psi down force.

34. A system for chemical mechanical planarization, comprising:
    a semiconductor device comprising at least one surface, wherein the at least one surface has (1) a barrier layer selected from the group consisting of tantalum, tantalum nitride, tantalum tungsten silicon carbide, titanium, titanium nitride; (2) an interconnect metal layer selected from the group of copper, tungsten, cobalt, aluminum, or their alloys; and (3) a porous or non-porous dielectric layer;
    a polishing pad; and
    a polishing composition according to claim 1, wherein the at least one surface is in contact with the polishing pad and the polishing composition.

\* \* \* \* \*